US008492645B1

(12) United States Patent
Strahm

(10) Patent No.: US 8,492,645 B1
(45) Date of Patent: Jul. 23, 2013

(54) TRANSPORTABLE SOLAR POWER SYSTEM

(76) Inventor: Michael Strahm, Hull, MA (US)

(*) Notice: Subject to any disclaimer, the term of this patent is extended or adjusted under 35 U.S.C. 154(b) by 747 days.

(21) Appl. No.: 12/586,570

(22) Filed: Sep. 24, 2009

Related U.S. Application Data

(60) Provisional application No. 61/214,306, filed on Apr. 22, 2009.

(51) Int. Cl.
*H01L 31/042* (2006.01)
*F24J 2/38* (2006.01)

(52) U.S. Cl.
USPC ............ 136/244; 136/246; 126/600; 126/605

(58) Field of Classification Search
USPC .................................. 126/600, 605; 136/244
See application file for complete search history.

(56) References Cited

U.S. PATENT DOCUMENTS

| | | | |
|---|---|---|---|
| 1,888,620 A | 11/1932 | Clark | |
| 3,466,198 A * | 9/1969 | Yasui | 136/244 |
| 4,097,310 A * | 6/1978 | Lindmayer | 136/261 |
| 4,226,256 A | 10/1980 | Hawley | |
| 4,261,329 A | 4/1981 | Walsh et al. | |
| 4,421,943 A | 12/1983 | Wothjack | |
| 4,452,234 A | 6/1984 | Withjack | |
| 4,611,090 A * | 9/1986 | Catella et al. | 136/251 |
| 4,644,933 A | 2/1987 | Gregory | |
| 4,832,001 A | 5/1989 | Baer | |
| 5,542,203 A | 8/1996 | Luoma et al. | |
| 6,058,930 A | 5/2000 | Shingleton | |
| 6,201,181 B1 | 3/2001 | Azzam et al. | |
| 6,396,239 B1 | 5/2002 | Benn et al. | |
| 6,624,350 B2 * | 9/2003 | Nixon et al. | 136/244 |
| 6,737,573 B2 | 5/2004 | Yeh | |
| 6,809,251 B2 | 10/2004 | Dinwoodie | |
| 6,848,442 B2 * | 2/2005 | Haber | 126/600 |
| 6,960,717 B2 | 11/2005 | Stuart et al. | |
| 7,202,457 B2 | 4/2007 | Janus et al. | |
| 7,230,819 B2 | 6/2007 | Muchow et al. | |
| D560,606 S | 1/2008 | McClintock et al. | |
| 7,331,750 B2 * | 2/2008 | Merz et al. | 414/735 |
| 7,464,703 B2 | 12/2008 | Aaron | |
| 2004/0112373 A1 | 6/2004 | Djeu | |
| 2005/0161073 A1 | 7/2005 | Head et al. | |
| 2007/0158978 A1 * | 7/2007 | Woodhouse et al. | 296/210 |
| 2007/0215199 A1 | 9/2007 | Dold et al. | |
| 2007/0277868 A1 * | 12/2007 | Huang et al. | 136/246 |
| 2008/0264467 A1 | 10/2008 | Doko | |
| 2010/0071684 A1 * | 3/2010 | Cowan et al. | 126/605 |

* cited by examiner

*Primary Examiner* — Jennifer K. Michener
*Assistant Examiner* — Marla D McConnell
(74) *Attorney, Agent, or Firm* — John P. McGonagle

(57) ABSTRACT

A transportable, self-contained, solar power system comprised of a plurality of individual solar power arrays, each array being contained within a transportable frame. Each array is folded into a frame during transportation. Upon reaching a desired location, the frame is positioned at a desired location. The frame then acts as a base while its solar power array is activated and deployed. The array has the capability of tracking the position of the sun during deployment. Each frame has a global positioning system (GPS) and a controller containing a chart of sun locations for a given location. The controller positions a frame's solar array to maximize the array's exposure to the sun. Each frame has a battery system, enabling a frame's solar array to self-start after a period of darkness.

4 Claims, 13 Drawing Sheets

US 8,492,645 B1

TRANSPORTABLE SOLAR POWER SYSTEM

CROSS-REFERENCE TO RELATED APPLICATIONS

Applicant claims the priority benefits of U.S. Provisional Patent Application No. 61/214,306, filed Apr. 22, 2009.

BACKGROUND OF THE INVENTION

This invention relates generally to the field of solar energy and, in particular, to a transportable, self-contained, solar power system.

Mobile power supplies, operated with liquid fuels, are used in areas where conventional, electric power is unavailable or to supplement available electric power. Examples of this are areas where environmental and/or weather conditions have interrupted or destroyed conventional power grids. Other examples are undeveloped areas, remote areas, or sparsely populated areas without electric power or with limited available power, industrial applications, and military deployments. Prior art mobile power supplies are primarily limited by the fuel necessary for operation. The fuel may be either unavailable, untransportable or too dangerous to be supplied to a desired site.

SUMMARY OF THE INVENTION

The present invention overcomes the limitations of prior art mobile power supplies by providing a transportable, self-contained, solar power system comprised of a plurality of individual solar power arrays, each array being contained within a transportable frame. Each array is folded into a frame during transportation. Upon reaching a desired location, the frame is positioned at a desired location, leveled and anchored. The frame then acts as a base while its solar power array is activated and deployed. If, during deployment, weather or environmental conditions become severe, the array may be folded back into its frame until conditions improve. The array has the capability of tracking the position of the sun during deployment. Each frame has a global positioning system (GPS) and a controller containing a chart of sun locations for a given location. The controller positions a frame's solar array to maximize the array's exposure to the sun. Each frame has a battery system, enabling a frame's solar array to self-start after a period of darkness.

Power requirements for a given location can be met by a single or plurality of frames. Each frame provides between 2800 and 3600 watts of power. Where a plurality of frames are desired, the arrays may be electrically and electronically ganged together. Each frame is sized to fit on a flat bed trailer or within a cargo container. Where possible the use of a tractor trailer or tractor train provides transportation to a desired site along with a desired number of frames. Where road transportation is difficult or impossible, or the distances involved are substantial, cargo containers may be transported by boat, airplane, helicopter, or the like, to the actual desired location or a nearby location for truck transport to the actual desired site. Up to seven frames may fit on a conventional flat bed trailer, and up to fourteen on a conventional tractor train. Up to five frames may fit within a conventional cargo container.

These together with other objects of the invention, along with various features of novelty which characterize the invention, are pointed out with particularity in the claims annexed hereto and forming a part of this disclosure. For a better understanding of the invention, its operating advantages and the specific objects attained by its uses, reference should be had to the accompanying drawings and descriptive matter in which there is illustrated a preferred embodiment of the invention.

DETAILED DESCRIPTION OF THE INVENTION

Figure 1:
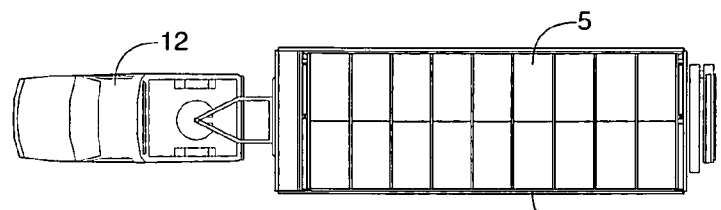
FIG. 1 is a top plan view of a plurality of frames on a gooseneck trailer hauled by a pickup.
Figure 2:
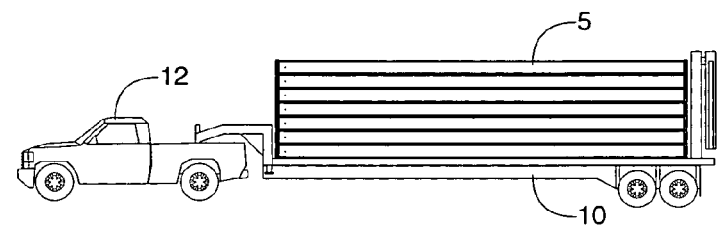
FIG. 2 is a side view thereof.
Figure 3:
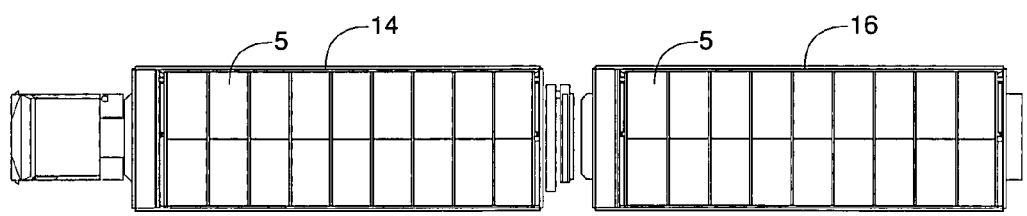
FIG. 3 is a top plan view of a tractor train with a plurality of frames on flat bed trailers hauled by a tractor trailer.
Figure 4:
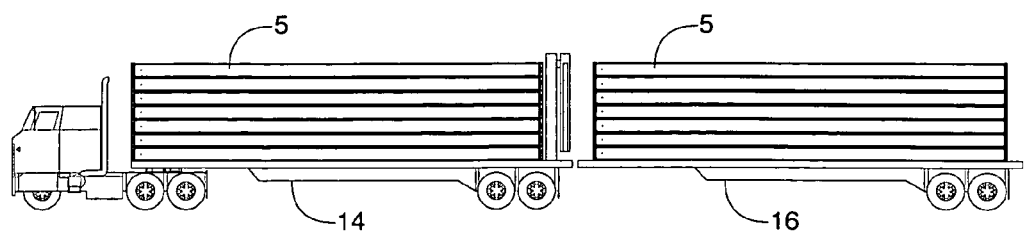
FIG. 4 is a side view thereof.
Figure 5:
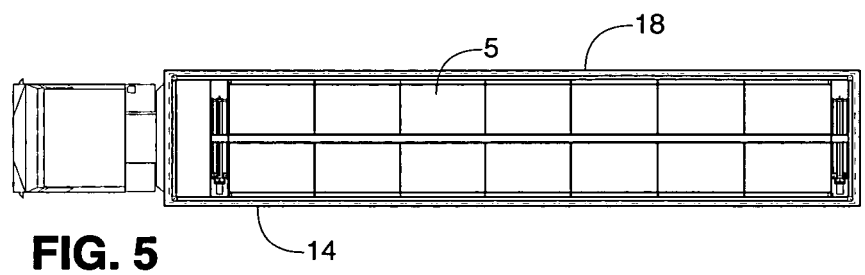
FIG. 5 is a top plan view of a plurality of frames within a containerized cargo container.
Figure 6:
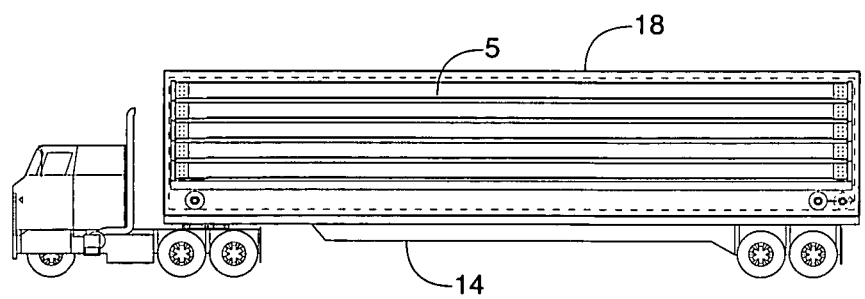
FIG. 6 is side view thereof.
Figure 7:
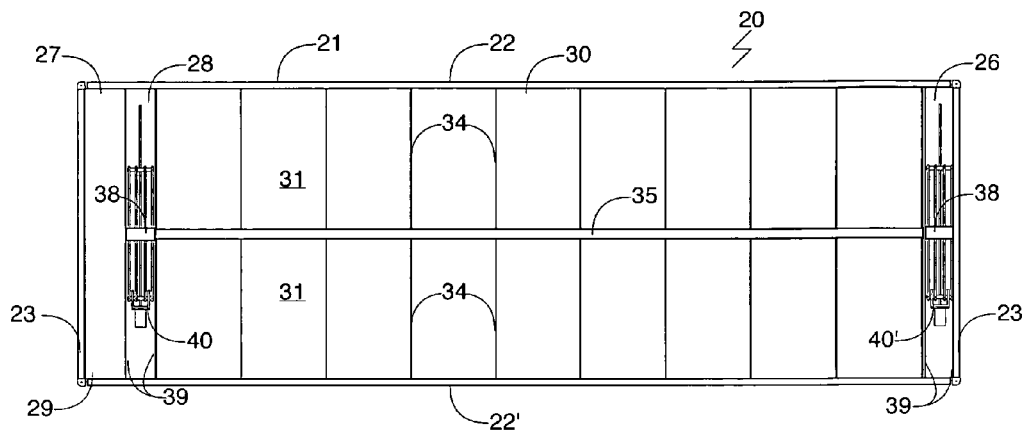
FIG. 7 is a top plan view of a uni-tracker array in a closed position for trailer distribution.
Figure 8:
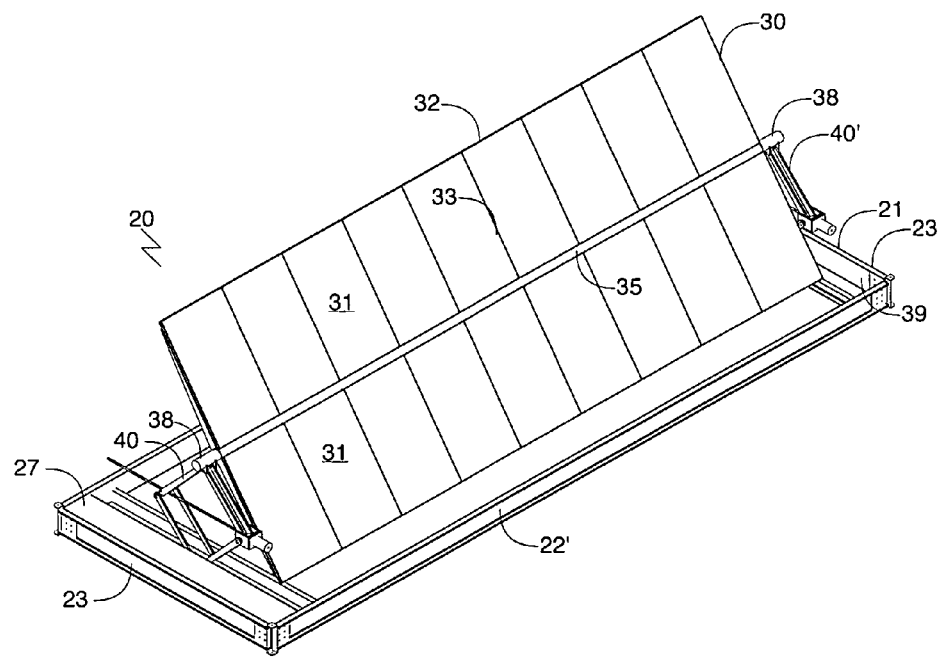
FIG. 8 is a top perspective view of the uni-tracker of FIG. 7 in an open deployed position.
Figure 9:
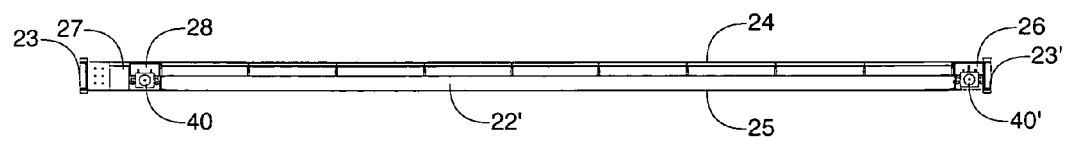
FIG. 9 is a front view of the uni-tracker of FIG. 7.
Figure 10:
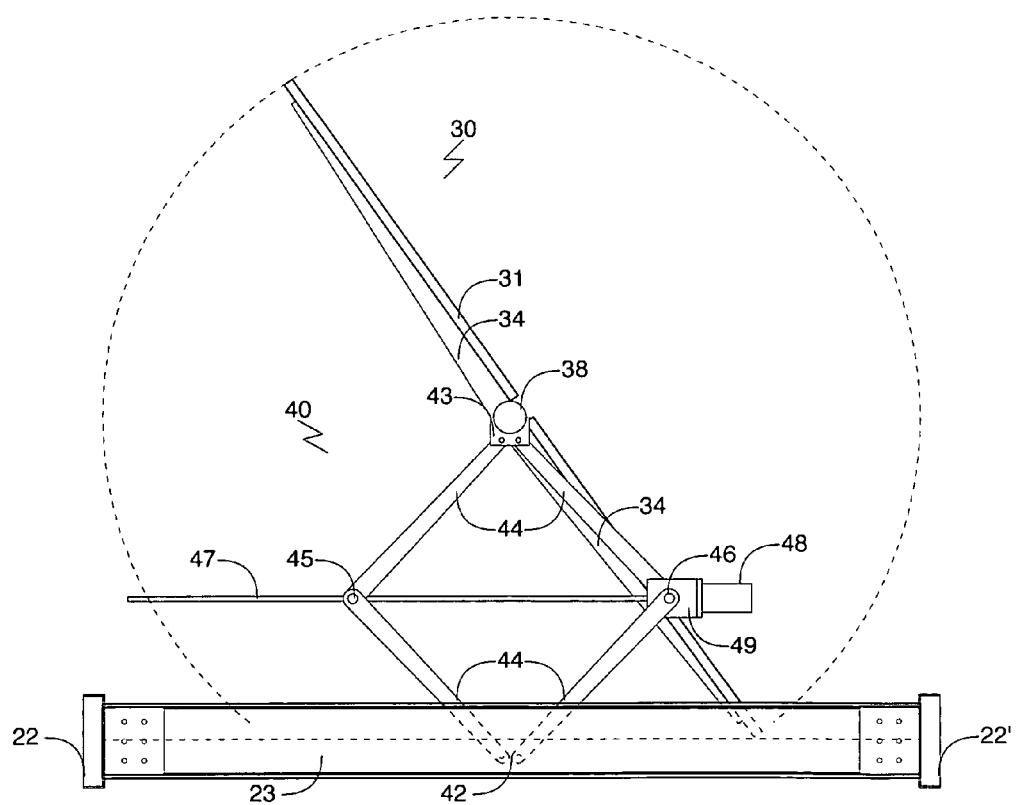
FIG. 10 is a side view of the uni-tracker of FIG. 8.
Figure 11:
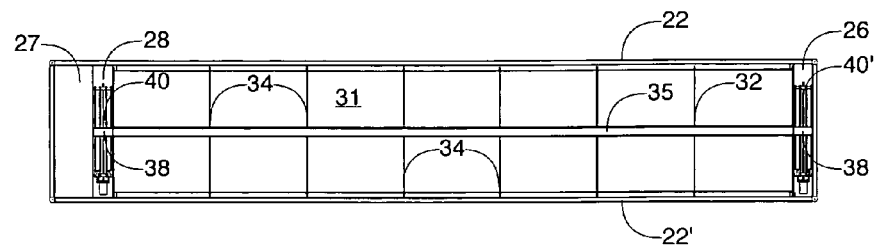
FIG. 11 is a top plan view of a uni-tracker array in a closed position for shipping container distribution.
Figure 12:
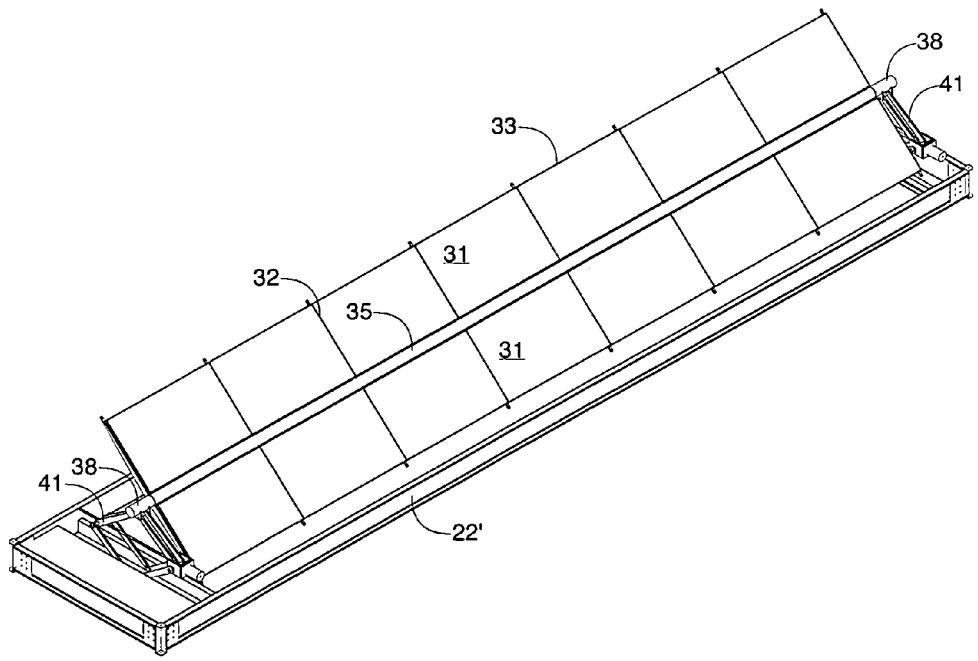
FIG. 12 is a top perspective view of the uni-tracker of FIG. 11 in an open deployed position.
Figure 13:
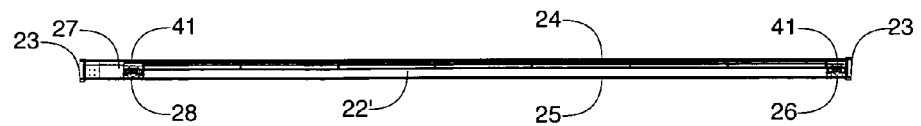
FIG. 13 is a front view of the uni-tracker of FIG. 11.
Figure 14:
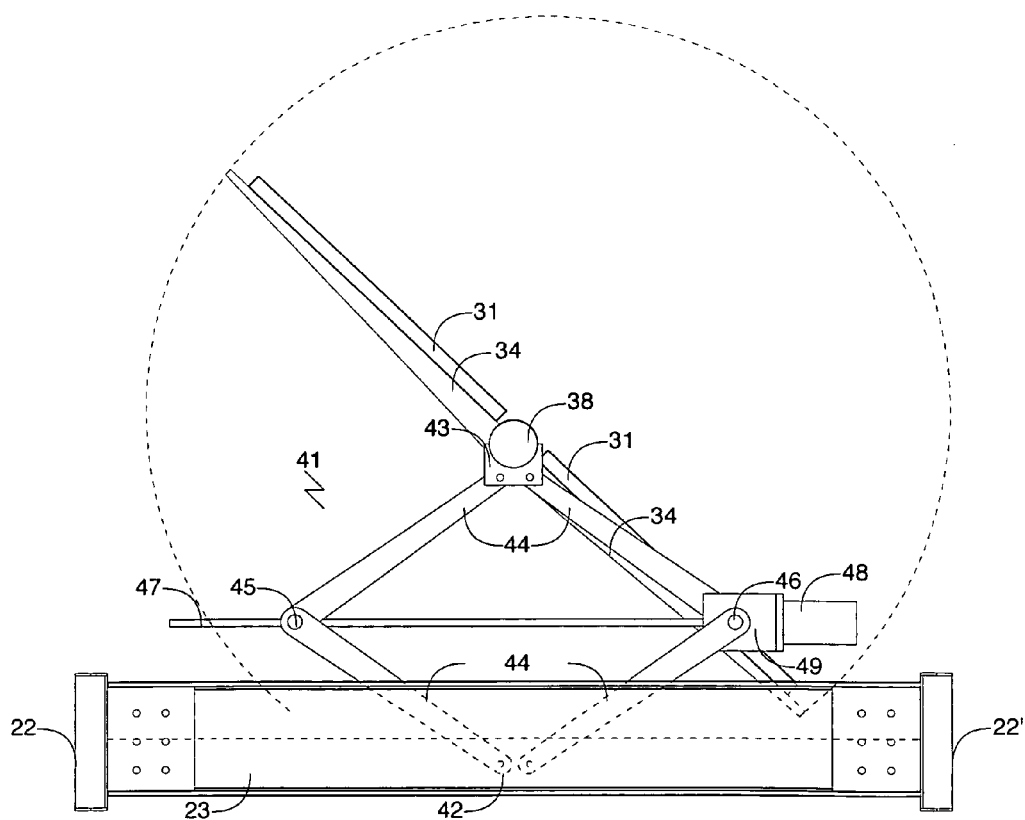
FIG. 14 is a side view of the uni-tracker of FIG. 12.

Referring to the drawings in detail wherein like elements are indicated by like numerals, there are illustrated in FIGS. 1 and 2, a trailer unit 10 hauled by a pickup truck 12. The trailer unit 10 contains a plurality of array frames 5. FIGS. 3 and 4 illustrate a tractor train comprised of a tractor trailer 14 and a towed trailer 16. The tractor trailer 14 and towed trailed 16 contain a plurality of array frames 5. FIGS. 5 and 6 illustrate a tractor trailer 14 supporting a cargo container 18 holding a plurality of array frames 5.

The array frames 5 are of two basic types, uni-tracker 20 and dual tracker 50. A uni-tracker array frame 20 is comprised of a frame 21 containing a solar panel array 30 joined to the frame 21 by means of a positioning apparatus 40 adapted to lift the solar panel array 30 above the frame and rotate the solar panel array 30 about a single longitudinal axis. A dual tracker array frame 50 is comprised of a frame 51 containing a solar panel array 70 joined to the frame 51 by means of a positioning apparatus 80 adapted to lift the solar panel array 70 above the frame and rotate the solar panel array 70 about two axes. Each basic array frame type 20 and 50 is also constructed in one of two versions having different frame dimensions. One set of dimensions is adapted to fit onto a trailer 10, 14, 16 of conventional size meeting government specifications for road travel. The other set of dimensions is adapted to fit into a conventional cargo container 18.

Figure 15:
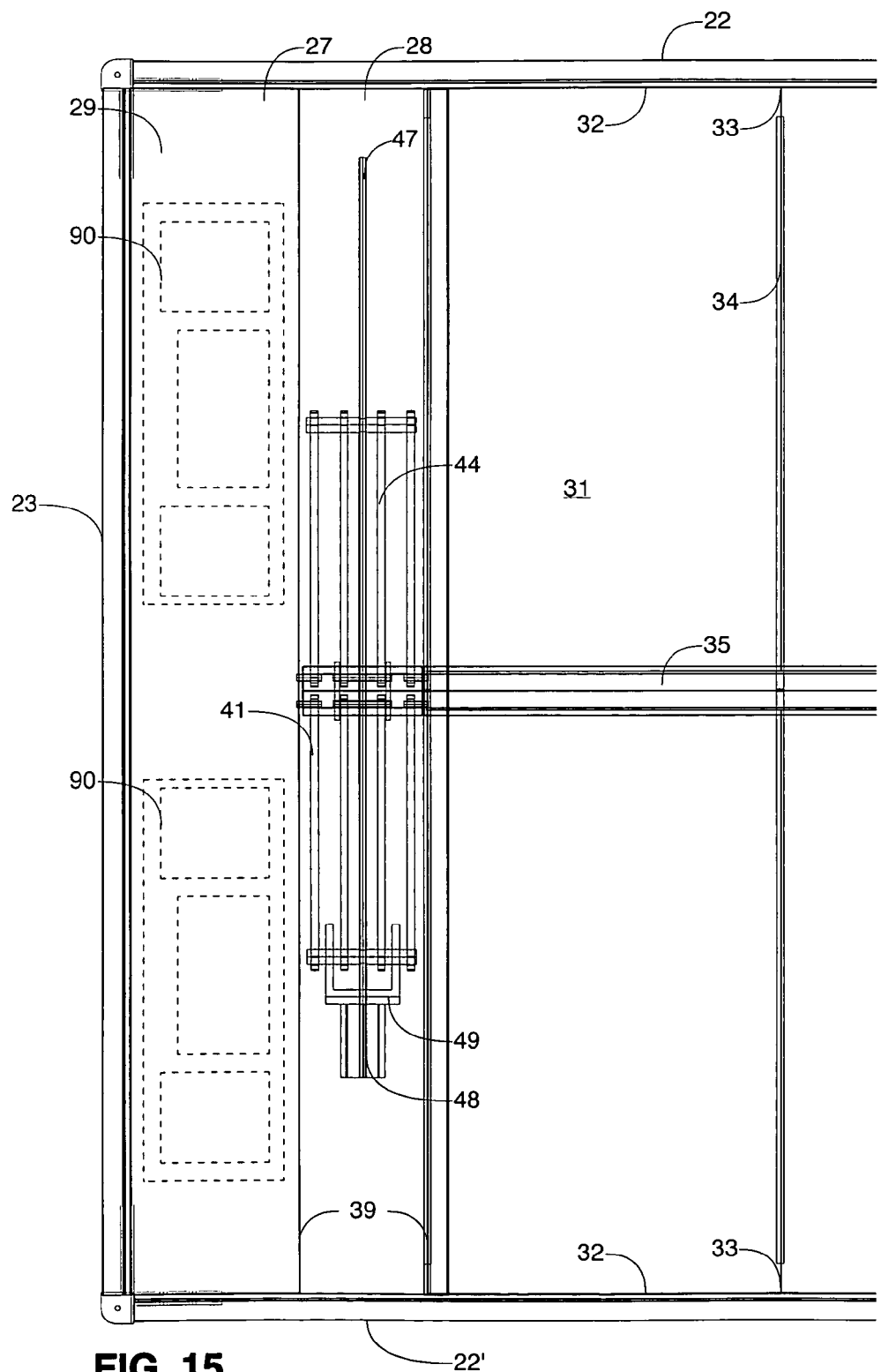
FIG. 15 is a top view of the uni-tracker motor system.
Figure 16:
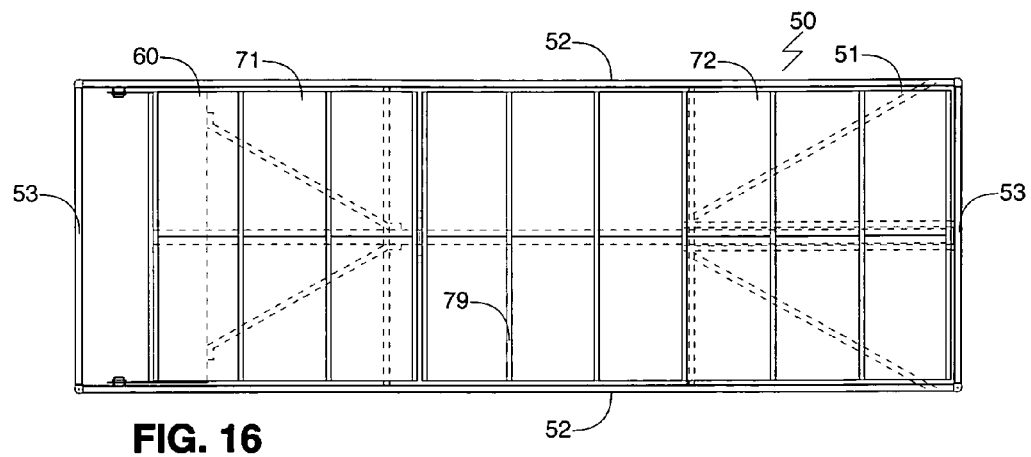
FIG. 16 is a top plan view of a dual tracker array in a closed position for trailer distribution.
Figure 17:
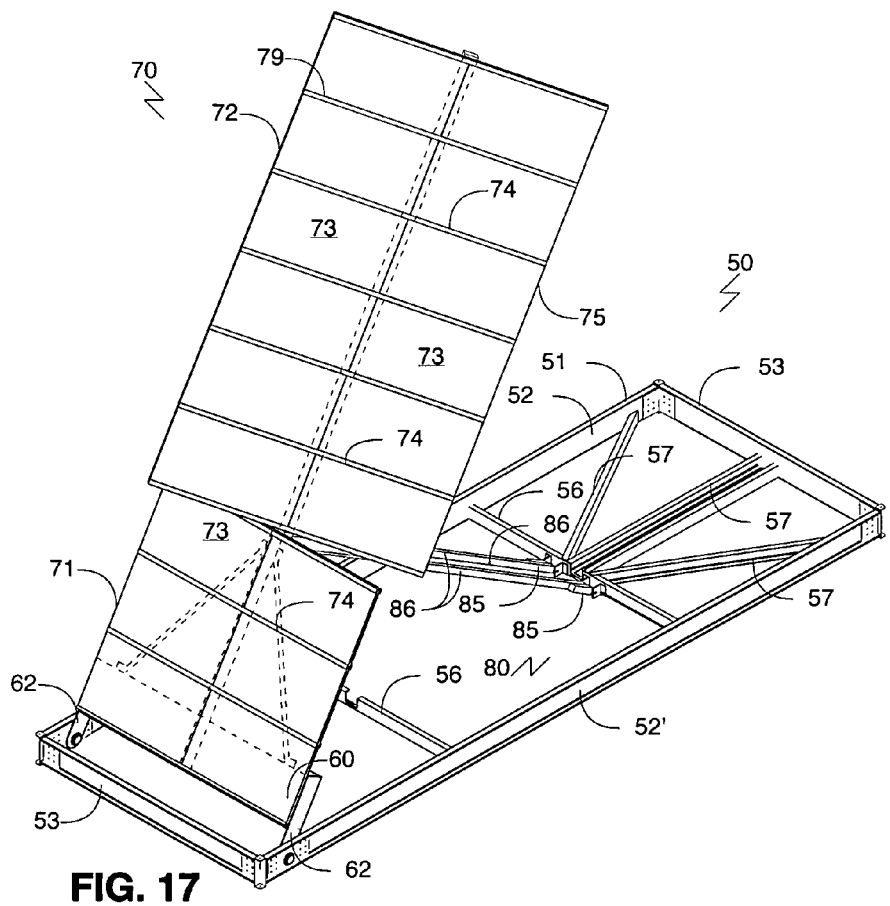
FIG. 17 is a top perspective view of the dual tracker of FIG. 16 in an open deployed position.
Figure 18:
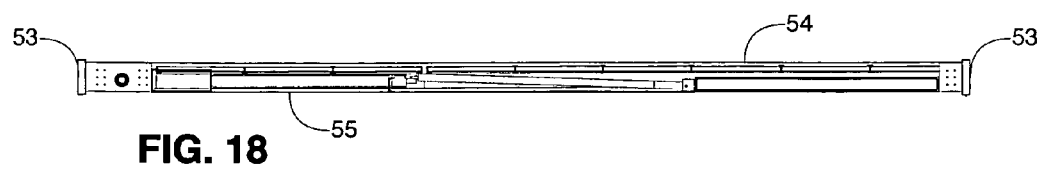
FIG. 18 is a front view of the dual tracker of FIG. 16.
Figure 19:
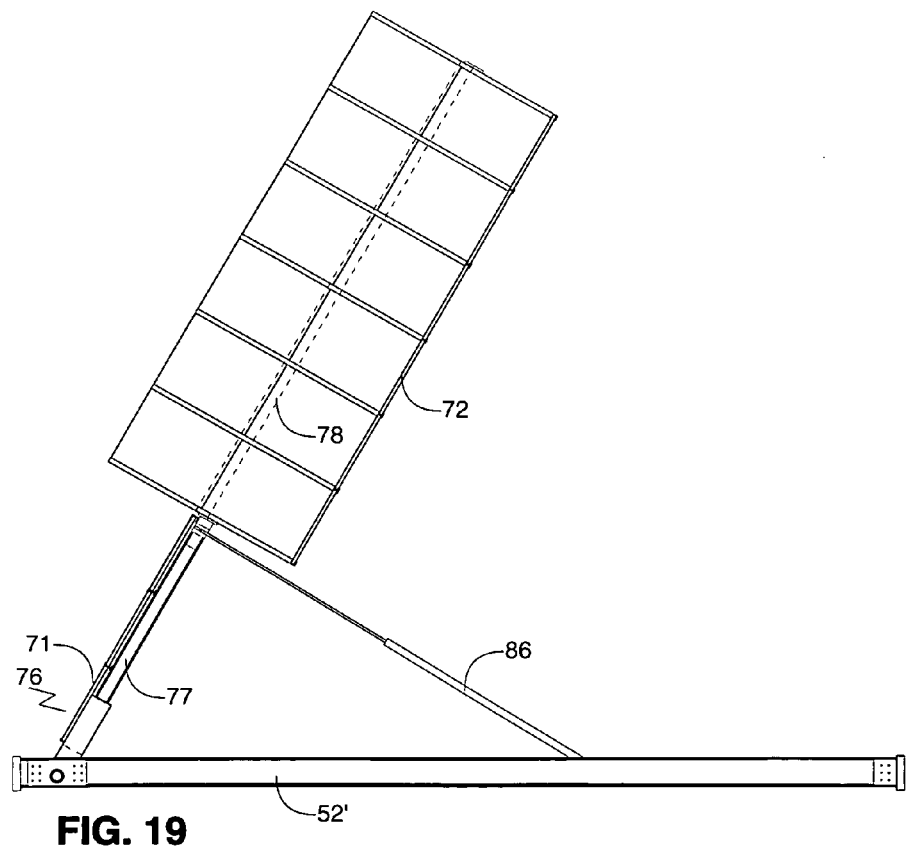
FIG. 19 is a front view of the dual tracker of FIG. 17.
Figure 20:
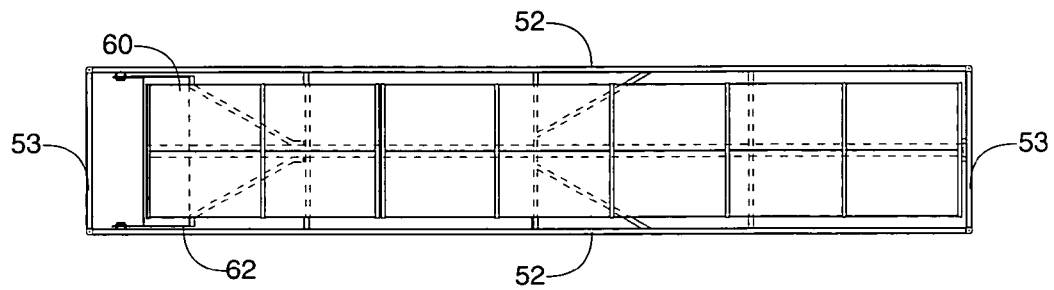
FIG. 20 is a top plan view of a dual tracker array in a closed position for shipping container distribution.
Figure 21:
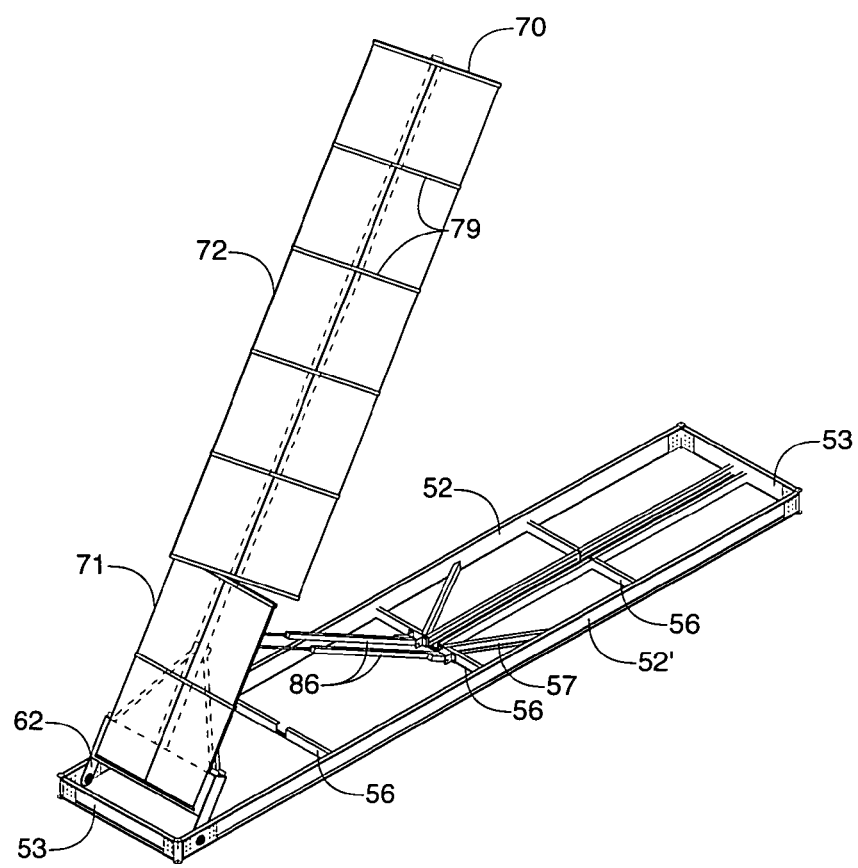
FIG. 21 is a top perspective view of the dual tracker array of FIG. 20 in an open deployed position.
Figure 22:
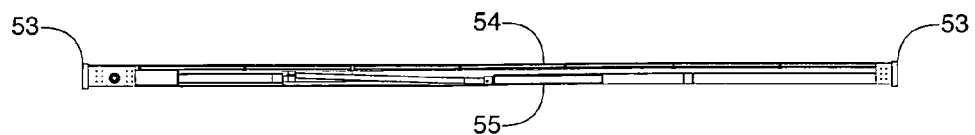
FIG. 22 is a front view of the dual tracker of FIG. 20.
Figure 23:
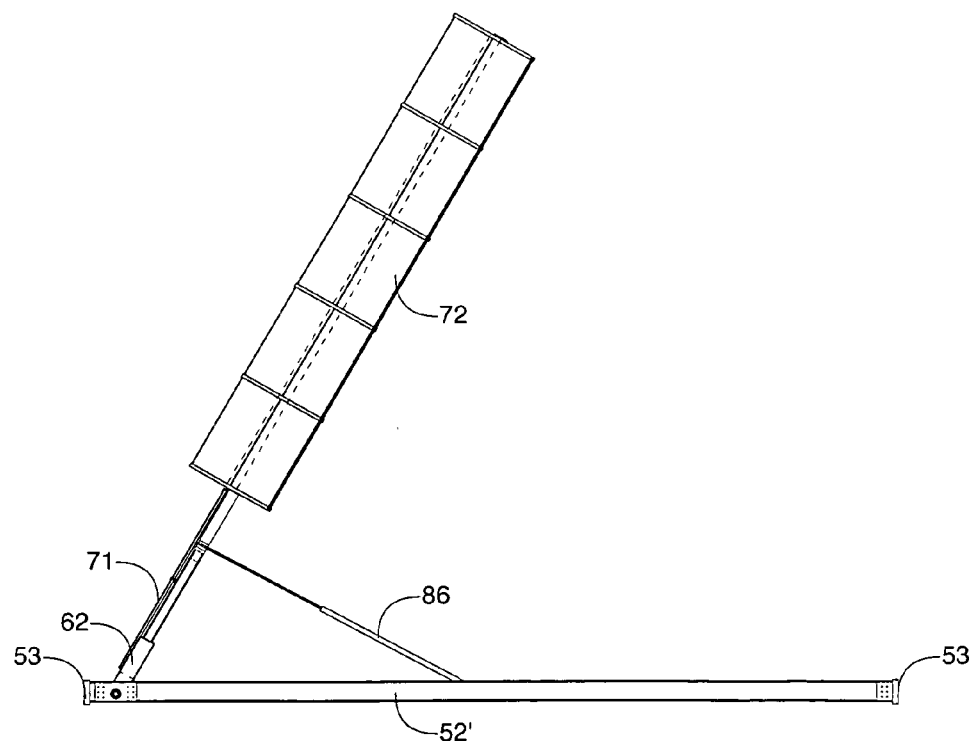
FIG. 23 is a front view of the dual tracker of 21.

Referring more particularly to FIGS. 7-15, there is shown a single, uni-tracker array frame 20. FIGS. 7-10 illustrate a uni-tracker array frame version adapted to fit onto a trailer. FIGS. 11-14 illustrate a uni-tracker array frame version adapted to fit into a cargo container. FIG. 15 further illustrates the positioning apparatus 40 adapted for use with either uni-tracker version.

The uni-tracker array frame 21 is rectangular in shape and has two, opposite, long side bars 22 terminating in two, opposite, short side bars 23. The short side bars 23 define a frame longitudinal axis. The long side bars 22 define a frame transverse axis. The frame 21 has a top 24 and a bottom 25. One long side bar 22' is defined as the frame front and the other long side bar 22 as the frame rear. The uni-tracker frame 21 has three transverse slots contained therein. The first slot 26 contains right side positioning apparatus 40' and is positioned adjacent the uni-tracker frame right short side bar 23', extending from long side bar 22 to long side bar 22'. The second slot 27 contains uni-tracker electric and electronic wiring means 90 and is positioned adjacent the uni-tracker frame left short side bar 23, extending from long side bar 22 to long side bar 22'. The third slot 28 contains left side positioning apparatus 40 and is positioned adjacent the second slot 27 and extends from long side bar 22 to long side bar 22'. The second slot 27 has a solid floor 29 on the frame bottom 25 fixedly attached to each long side bar 22, 22' and an adjacent short bar 23.

The right and left side positioning apparatus 40, 40' are each comprised of a scissors jack 41 of known construction. Each scissor jack 41 has a base portion 42 fixedly attached to the transverse sides 39 within the scissor jack respective slots 26, 28. Each scissor jack 41 has an upper portion 43 supporting a cylindrical motor housing 38 engaging an elongated hollow rod 35, said rod 35 interconnecting both scissors jacks 41 and having a longitudinal axis parallel to the frame longitudinal axis. Each scissor jack 41 has a scissors-like linkage means 44 connecting the base and upper portions 42, 43. Each scissors jack 41 includes a first member 45 forming one of the linkage pivot connections, said first member 45 also threadingly receiving a jack operating screw 47. The screw 47 rotatably extends through a second member 46, opposite the first member 45, which forms another pivot point for the linkage 44. One end of the screw 47 terminates in a jack actuator comprised of a cylindrical electric motor/gear box 48 attached to a mounting bracket 49.

As stated above the uni-tracker array frame 20 is comprised of a frame 21 containing a solar panel array 30 joined to the frame 21 by means of a positioning apparatus 40 adapted to lift the solar panel array 30 above the frame and rotate the solar panel array 30 about a single longitudinal axis. The solar panel array is comprised of a double row of solar panels 31 interconnected to the said elongated rod 35. The panels 31 have a generally rectangular shape and are positioned so that their longitudinal axes are parallel to the transverse axis of the frame 21. Each panel 31 is fixedly attached to a support arm 34 which runs perpendicular to and is fixedly attached to the elongated rod 35. The panels 31 are arranged so that they all lie in the same plane. The elongated rod 35 is attached to the internal rotating component of an in-line, planetary-geared motor within the cylindrical motor housing 38 wherein the rod 35 is adapted to being turned thereby axially rotating the array of panels about the elongated rod longitudinal axis.

As stated above, the dimensions of the frame 21 determine whether the uni-tracker 20 is adapted to fit onto a trailer or into a conventional cargo container. The uni-tracker 20 illustrated in FIGS. 7-10 is designed to fit onto a trailer. FIGS. 11-14 illustrate a uni-tracker 20 adapted to fit into a cargo container. The frame 21 for a cargo container must be narrower, i.e., the short bars 23 dimensionally less. The positioning apparatus 40 remains the same in design and function but are sized smaller to adapt to the shorter width of the frame. However, the arrangement of solar panels 31 must be changed. For the cargo container version of the uni-tracker, the solar panels 31 are positioned so that their longitudinal axes are parallel to the longitudinal axis of the frame 21. Each panel 31 is fixedly attached to a support arm 34 along a panel short side 32. The support arms 34 run perpendicular to and are fixedly attached to the elongated rod 35. See FIGS. 11 and 12.

Figure 24:
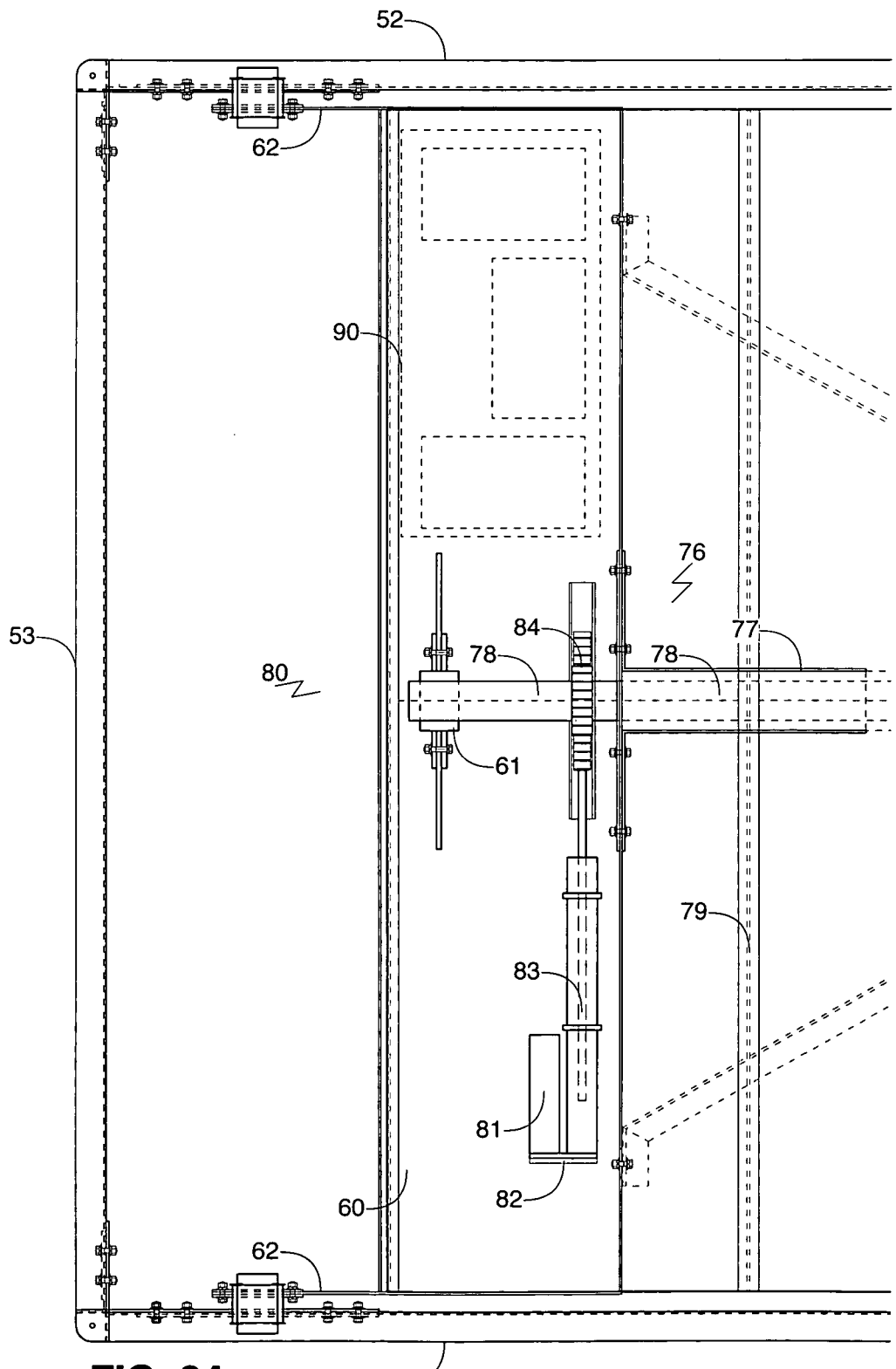
FIG. 24 is a top view of the dual tracker motor system.

Referring more particularly to FIGS. 16-24, there is shown a dual tracker array frame 50. FIGS. 16-19 illustrate a dual tracker array frame 50 version adapted to fit onto a trailer. FIGS. 20-23 illustrate a dual tracker array frame 50 version adapted to fit into a cargo container. FIG. 24 illustrates the positioning apparatus 80 adapted for use with either dual tracker version.

The dual tracker array frame 51 is rectangular in shape and has two, opposite, long side bars 52 terminating in two, opposite, short side bars 53. The short side bars 53 define a frame longitudinal axis. The long side bars 52 define a frame transverse axis. The frame 51 has a top 54 and a bottom 55. One long side bar 52' is defined as the frame front and the other long side bar 52 as the frame rear. The frame 51 has one or more transverse braces 56 fixedly interconnecting the frame front 52' and rear 52. Two support struts 57, one each fixedly attached to a long side bar 52, terminate at the transverse brace 56. The dual tracker frame 51 also has a box 60 with a closed top pivotally attached to the long side bars 52 near to one of the short side bars 53 by means of support arms 62 fixedly attached to the box 60. The box 60 contains a portion of the dual tracker positioning apparatus 80 as well as system electrical and electronics means 90.

The dual tracker solar panel array 70 is comprised of two segments, a proximal segment 71 and a distal segment 72. Each segment 71, 72 is comprised of a double row of solar panels 73 interconnected to a central rod assembly 76. Each panel 73 has a generally rectangular shape and is positioned so that its longitudinal axis is parallel to the transverse axis of the frame 51. Each panel 73 is fixedly attached to the central rod assembly 76 by a slotted arm 79 along a panel long side 74. The panels 73 for each segment 71, 72 are arranged so that they lie in the same segment plane.

The central rod assembly 76 is comprised of two concentric tubes, an outer square tube 77 with the proximal segment panels 73 attached thereto, and an interior round tube 78 extending out of the outer tube 77 and having the distal segment panels 73 attached thereto. The central rod assembly 76 is seated on a bearing plate 61 fixedly set within the frame box 60, and extends in the general direction of the frame central longitudinal axis.

The positioning apparatus 80 is comprised in part of a motor 81 located in the frame box 60. The motor 81 is attached by means of a transmission/gear box 82 to an electric actuator shaft 83. The electric actuator shaft 83 has a longitudinal axis parallel to the frame transverse axis. The electric actuator shaft 83 terminates in a rack and pinion gear assembly 84 operatively attached to the central rod assembly inner tube 78. The positioning apparatus 80 is further comprised of two electric motors 85 attached to the frame transverse brace 56. The two motors 85 drive two actuator shafts 86 extending from the transverse brace 56 and terminating at the central rod assembly outer tube 77.

The central rod assembly 76 is adapted to being raised and lowered by the motor-driven actuator shafts 86 changing the angular orientation of the solar panel array 70 along the longitudinal axis of the frame 51. The central rod assembly inner tube 78 is adapted being rotated by the electric actuator shaft 83 thereby axially rotating the distal segment array of panels 73 about the central rod assembly longitudinal axis.

As stated above, the dimensions of the frame 51 determine whether the dual tracker 50 is adapted to fit onto a trailer or into a conventional cargo container. The dual tracker 50 illustrated in FIGS. 16-19 is designed to fit onto a trailer. FIGS. 20-23 illustrate a dual tracker 50 adapted to fit into a cargo container. The frame 51 for a cargo container must be narrower, i.e., the short bars 53 dimensionally less. The positioning apparatus 80 remains the same, however the arrangement of solar panels 73 must be changed. For the cargo container version of the dual tracker, the solar panels 73 are positioned so that their longitudinal axes are parallel to the longitudinal axis of the frame 51. Each panel 73 is fixedly attached to a support arm 79 along a panel short side 75, said support arm being fixedly attached to the central rod assembly 76.

Figure 25:
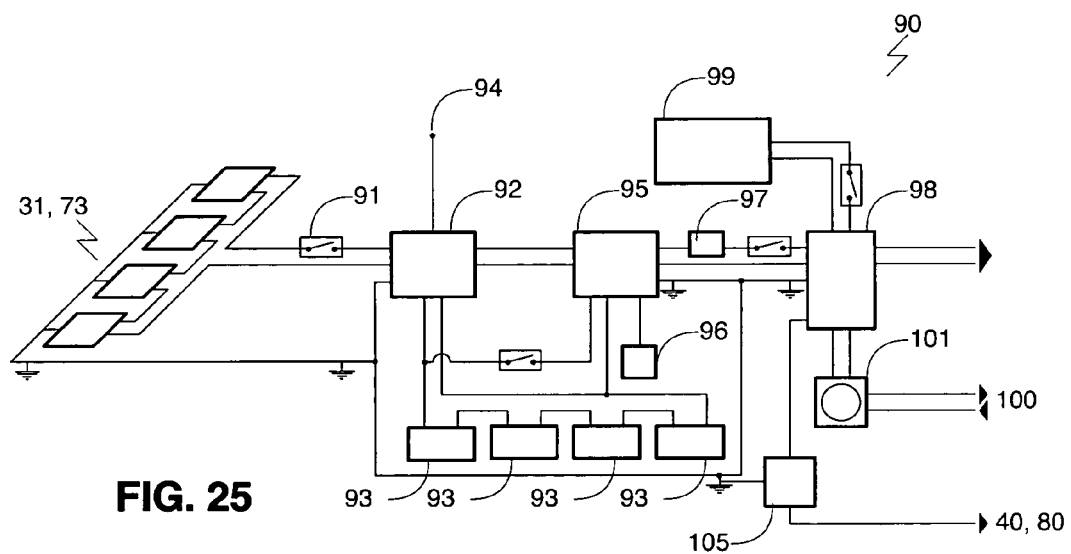
FIG. 25 is a diagram of the electrical system for either the uni-tracker or dual tracker arrays.

Referring more particularly to FIG. 25, there is shown a schematic diagram illustrating the electrical and electronic means 90 used with both the uni-tracker and dual tracker arrays 20, 50. The solar panels 31, 73 in the arrays provide a DC output to a charge controller 92. A DC disconnect 91 is also provided whereby the electrical and electronic means 90 may be isolated from the solar panel output. The charge controller 92 initially directs a DC charging voltage to one or more batteries 93. An external source input means 94 may be provided to initially charge the batteries 93. A portion of the DC output from the charge controller 92 is provided to a DC-AC converter 95. A system monitor 96 and AC meter 97 may also be provided. The output from the DC-AC converter 95 is provided to a main AC panel 98. An optional, local AC backup generator is represented at 99. A portion of the AC output may be provided to or from a utility grid 100, said utility grid transmission measured by an AC net meter 101.

Each uni-tracker 20 and dual tracker 50 is controlled by a system controller 105. The system controller 105 provides, in part, a GPS function determining the precise location of a particular tracker. The system controller 105 contains tables in storage that determines the exact location of the sun during the day and month for that particular location. The system controller provides commands to the positioning apparatus 40, 80 lifting, lowering and turning the solar panel arrays 30, 70 to maximize the gathering of solar energy. In case of severe weather or environmental conditions, the system controller may be manually, automatically or remotely commanded to fold down all tracker solar arrays into their respective frames. The charged batteries provide means to restart the solar energy gathering process. In case of total battery discharge, an external charging voltage 94 may be provided to the system, e.g., from a truck battery or other generator. In larger systems where a number of arrays are ganged together, one system controller may be assigned to multiple arrays, as may battery backup and the like.

It is understood that the above-described embodiment is merely illustrative of the application. Other embodiments may be readily devised by those skilled in the art which will embody the principles of the invention and fall within the spirit and scope thereof.

The invention claimed is:

1. A transportable solar power system comprising:
   a generally rectangular dual tracker array frame having a top, a bottom, a front, a rear, two opposite, long side bars terminating in two opposite, short side bars, said short side bars defining the frame front and rear, and a frame longitudinal axis, said long side bars defining a frame transverse axis;
   a central rod assembly comprised of two concentric tubes, an outer tube and an interior tube, said interior tube having a portion concentrically within said outer tube and a portion extending out of the outer tube, said central rod assembly being seated on a bearing plate fixedly set within the frame;
   a dual tracker solar panel array comprised of two segments, a proximal segment and, a distal segment, each segment being comprised of a double row of generally rectangular solar panels lying in a same segment plane, said proximal segment solar panels in direct physical contact with said central rod outer tube, said distal segment solar panels in direct physical contact with said central rod interior tube portion extending out of the outer tube;
   a plurality of motor-driven actuator shafts each having an end attached to said frame and another end attached to said central rod assembly outer tube, said motor-driven actuator shafts pivotally lifting and lowering said central rod assembly outer tube about said bearing plate and changing the angular orientation of the dual tracker solar panel array in relation to the longitudinal axis of the frame;
   an electric actuator shaft within said frame connected to said central rod assembly inner tube, said electric actuator shaft axially rotating said central rod assembly inner tube thereby rotating the distal segment array of panels about a central rod assembly longitudinal axis;
   electric and electronic wiring means within said frame for distributing and controlling power from said solar power array;
   a system controller providing a global positioning system (GPS) determining the precise location of said frame, said system controller containing a plurality of tables in a storage means adapted to determine the exact location of the sun during each day and month at the precise location of the frame, said system controller providing positioning commands to said motor-driven actuator shaft and said electric actuator shaft;
   a battery system in said frame attached to said electric and electronic wiring means for storing a portion of the electrical power generated by the solar panel array.

2. A transportable solar power system as recited in claim 1, wherein:
   said frame has a plurality of transverse braces fixedly interconnecting the frame front and rear;
   wherein said frame has a plurality of support struts fixedly attaching a long side bar to a transverse brace;
   wherein said frame has a generally rectangular box with a closed top pivotally attached to the long side bars near to one of the short side bars by means of plurality of support arms fixedly attached to the box, said box containing said electric actuator shaft and said electric and electronic wiring means.

3. A transportable solar power system as recited in claim 2, further comprising:
   a motor located in the said box, said motor being attached to a transmission/gear box to said electric actuator shaft, said electric actuator shaft having a longitudinal axis parallel to the frame transverse axis, said electric actuator shaft terminating in a rack and pinion gear assembly operatively attached to the central rod assembly inner tube;
   two electric motors attached to a frame transverse brace, said electric motors driving the two motor-driven actuator shafts extending from the said frame transverse brace and terminating at the central rod assembly outer tube.

4. A transportable solar power system as recited in claim 3, wherein said electric and electronic wiring means is further comprised of:

a charge controller receiving a direct current (DC) from said solar panels, said charge controller directing a portion of said DC current to said battery system, said charge controller directing another portion of said DC current to a direct current-analog current (DC-AC) converter, said DC-AC converter providing an AC power to a main AC panel.

\* \* \* \* \*